United States Patent [19]

Lu

[11] Patent Number: 5,079,457

[45] Date of Patent: Jan. 7, 1992

[54] DUAL SOLID STATE RELAY

[76] Inventor: Chao-Cheng Lu, 4-4, Alley 27, Lane 143, Chun Kung Road, Taipei, Taiwan

[21] Appl. No.: 631,420

[22] Filed: Dec. 21, 1990

[51] Int. Cl.[5] .................... H03K 17/72; H03K 17/79
[52] U.S. Cl. .................................. 307/632; 307/117; 307/242; 307/570
[58] Field of Search .............. 307/117, 239, 241, 242, 307/248, 570, 630, 631, 632

[56] References Cited

U.S. PATENT DOCUMENTS 4,158,150  6/1979  Dever ................................. 307/632
4,745,311  5/1988  Iwasaki ........................ 307/570 X Primary Examiner—David Mis
Attorney, Agent, or Firm—Fleit, Jacobson, Cohn, Price, Holman & Stern

[57] ABSTRACT

A dual solid state relay comprised of an input circuit, an optical coupler, a reference voltage circuit, a switch circuit, an SCR saturation circuit, a full wave bridge rectifier, a TRIAC driver circuit, an SCR driver circuit, a TRIAC slave circuit, an SCR slave circuit, a snobber circuit, and an output port. The TRIAC slave circuit and the SCR slave circuit are driven by the TRIAC driver circuit and the SCR driver circuit, respectively. The relay circuit is designed to employ additional TRIACs and SCRs in the event that the switching of very high currents and voltages becomes necessary. A further feature of the present invention is a SPDT switch which allows the user the opportunity of choosing which part of the relay circuit is utilized (TRIAC or SCR).

9 Claims, 2 Drawing Sheets

DUAL SOLID STATE RELAY

BACKGROUND OF THE INVENTION

The present invention relates to solid state relays, and in particular, to a solid state relay which utilizes TRIAC driven TRIACs in conjunction with SCR driven SCRs.

For many years, relay circuits have provided the ability to manipulate large currents and voltages in a main circuit by making minute changes in the parameters of a low power circuit. In this manner, for example, a low voltage (or current) automobile ignition key switch can control the delivery of a significantly larger amount of power from the car battery to the starter. Traditionally, this was accomplished inductively with relays that were bulky and rather expensive. In recent years, however, advances in the field of solid state technology have provided an assortment of lighter, smaller, and less expensive relays.

Although most solid state relays utilize a TRIAC as the main switch of the relay and use a DIAC to drive the TRIAC into its ON or OFF state, it is in many cases more desirable to utilize a TRIAC driven TRIAC or an SCR driven SCR to perform the ON and OFF function of the relay. In still further cases, it would be even more desirable for the user to selectively choose the type of relay circuit used (TRIAC or SCR) according to his/her particular needs, especially if these needs change.

SUMMARY OF THE INVENTION

Briefly, the dual solid state relay of the present invention comprises an input circuit, an optical coupler, a reference voltage circuit, a switch circuit, an SCR saturation circuit, a full wave bridge rectifier, a TRIAC driver circuit, a TRIAC slave circuit, an SCR driver circuit, an SCR slave circuit, a SPDT switch, and an output port.

The general operation of the solid state relay of the present invention is as follows. A small signal introduced at the relay input terminals controls a significantly larger flow of power through a pair of output terminals at the output port of the relay. In this manner, low power control circuits connected to the input can be used to determine the operation of a high voltage or current circuit connected to the output.

Additionally, the dual solid state relay of the present invention includes two distinct relay circuits which are combined to allow the user to choose between a TRIAC driven TRIAC mode of operation and an SCR driven SCR mode of operation. That is, the solid state relay of the present invention is comprised of two separate relay circuits. One is a TRIAC driven TRIAC relay and the other is an SCR driven SCR relay. Both relay circuits are connected to opposite contacts of the SPDT switch thus allowing the user of the solid state relay to selectively choose between them by simply selecting the appropriate switch position.

It is an object of the present invention to provide a solid state relay wherein a TRIAC is used as the main switch of the relay and wherein this TRIAC performs its ON and OFF function according to a gate voltage provided by another TRIAC contained in a TRIAC driver circuit.

It is another object of the present invention to provide a solid state relay wherein an SCR is used as the main switch of the relay and wherein this SCR performs its ON and OFF function according to a gate voltage provided by another SCR contained in the SCR driver circuit.

A further object of the present invention is to provide a solid state relay with a switch that affords the user the opportunity of switching between the use of the SCR relay to the use of the TRIAC relay.

An even further object of the present invention to provide a solid state relay having the capability of switching voltages and currents of unlimited magnitude by adding additional SCRs and TRIACs to the relay circuit.

DETAILED DESCRIPTION OF THE PREFERRED EMBODIMENT

Figure 1:
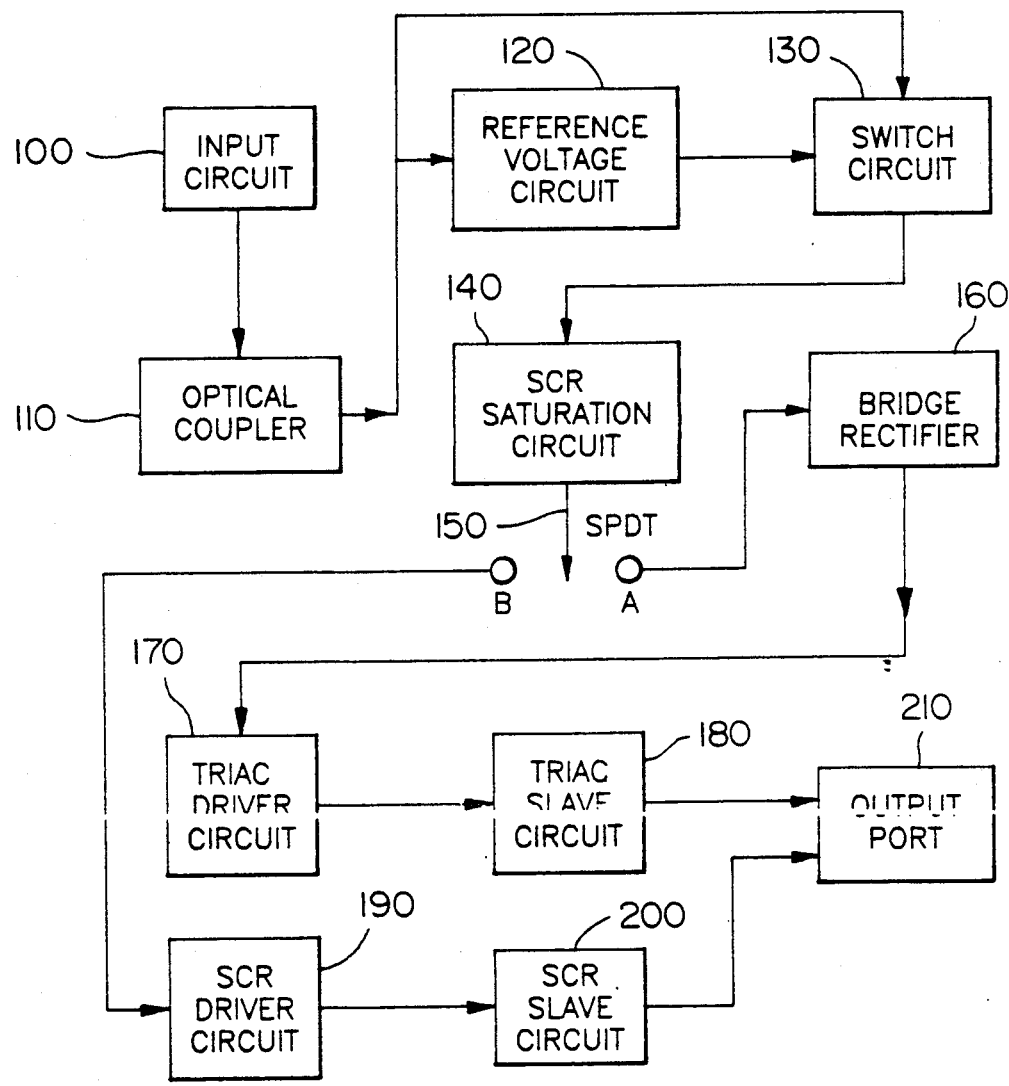
FIG. 1 is a block diagram of a dual solid state relay according to the present invention.

Referring first to FIG. 1, there is illustrated a preferred embodiment of the present invention including an input circuit 100 connected to an optical coupler 110. A reference voltage circuit 120 and a switch circuit 130 are provided and are each connected to the optical coupler 110. An SCR saturation circuit 140 is connected to the output of the switch circuit 130 and to a single-pole-double-throw (SPDT) switch 150 which is movable between contacts A and B. A full wave bridge rectifier 160 is connected to contact A which in turn is connected to a TRIAC driver circuit 170 to drive a TRIAC slave circuit 180. An SCR driver circuit 190 is connected to contact B and controls a SCR slave circuit 200. The TRIAC slave circuit 180 and the SCR slave circuit 200 are each connected to the output port 210.

Figure 2:
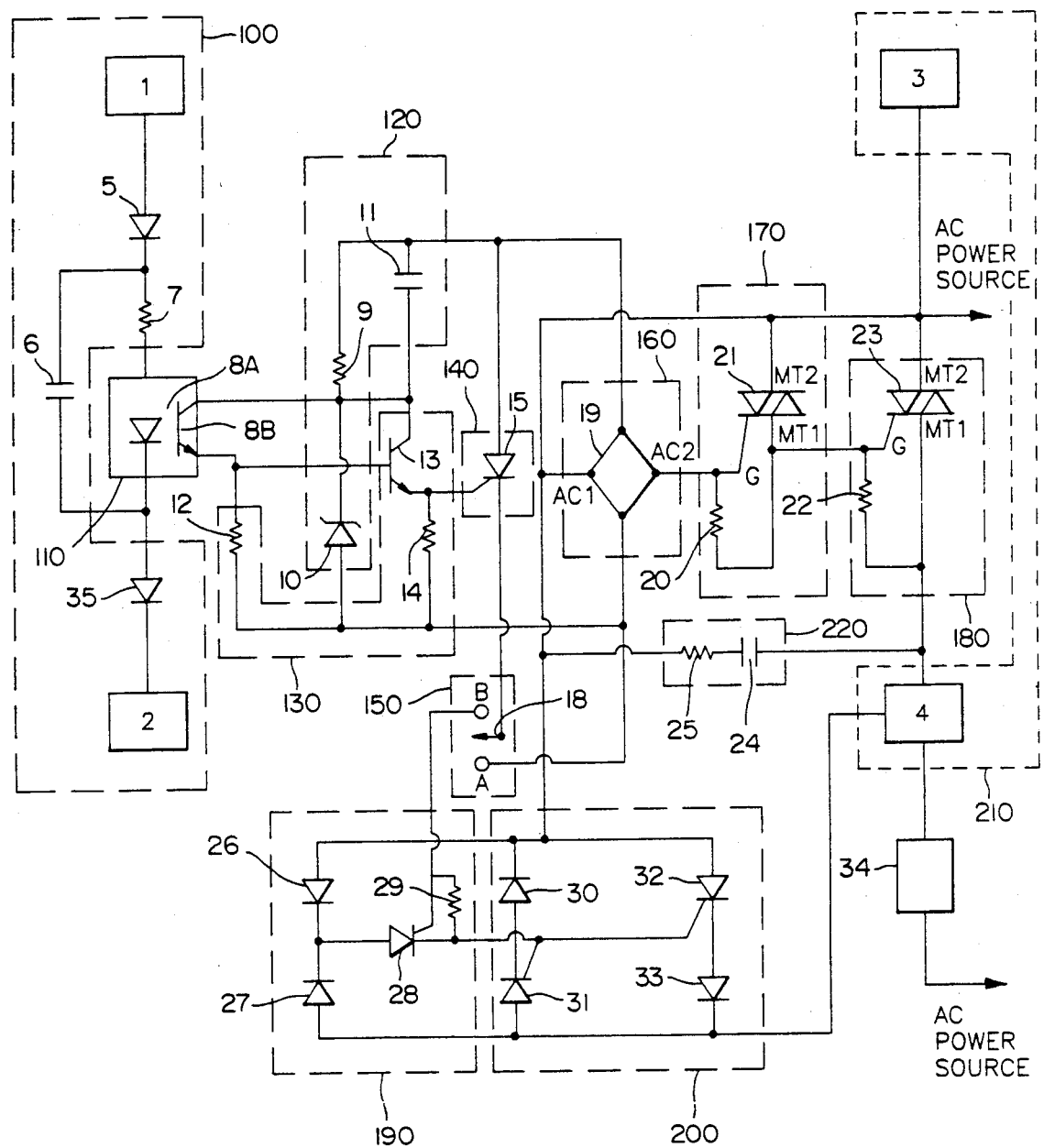
FIG. 2 is a schematic diagram of a dual solid state relay according to a preferred embodiment of the present invention.

A more detailed embodiment of the present invention is shown in FIG. 2. Specifically, the input circuit 100 comprises a first input terminal 1, a second input terminal 2, a current limiting resistor 7, a filtering capacitor 6, a diode 5, and a diode 35. The P-junction of the diode 5 is connected to the first input terminal 1 and the N-junction of the diode 5 is connected to a first terminal of the current limiting resistor 7 and to a filtering capacitor 6. The N-junction of the diode 35 is connected to the second input terminal 2 and the second terminal of the filtering capacitor 6 is connected to the P-junction of the diode 35.

The optical coupler 110 comprises a LED 8A and a transistor 8B and is connected to the input circuit 100 via the P-junction of the LED 8A and the limiting resistor 7 while the N-junction of the LED contained in the optical coupler 8 is connected to the P-junction of the second diode 35. The primary purpose of the optical coupler 110 is to provide the relay circuit with the required electrical isolation between the input terminals and output terminals.

The reference voltage circuit 120 comprises a resistor 9 connected to the N-junction of a zener diode 10 and a capacitor 11 connected to the opposite end of the resistor 9. The N-junction of the zener diode 10 is also connected to the collector of the transistor 8B of the optical coupler 110.

The switch circuit 130 acts as an amplifier and comprises a transistor 13, a base resistor 12 and an emitter resistor 14. The base of the transistor 13 and the resistor 12 are both connected to the emitter terminal of the transistor 8B. The second terminal of the base resistor 12 is connected to the P-junction of the zener diode 10 and to the emitter resistor 14.

The SCR saturation circuit 140 essentially comprises an SCR 15 having a gate connected to the emitter of the transistor 13 of the switch circuit 130 and a cathode connection to the SPDT switch 150. The SPDT switch 150 consists of a switch member 18 movable between switch positions A and B.

The SCR saturation circuit 140 is designed to control the ON and OFF operation of the TRIAC driver circuit 170 and the SCR driver circuit 190 according to the position of the SPDT switch 150. However before this can be accomplished, the output signal from the optical coupler 110 must be amplified. For this reason, the switch circuit 130 which provides the needed amplification, is disposed between the SCR saturation circuit 140 and the optical coupler 110. The primary purpose of the switch circuit 130 is to amplify the signal from the optical coupler 110 for use by the SCR saturation circuit 140.

The full wave bridge rectifier circuit 160 comprises a full wave bridge rectifier 19 having a positive terminal connected to the anode of the SCR 15 and a negative terminal connected to switch contact A.

The TRIAC driver circuit 170 comprises a first gate resistor 20 and a TRIAC 21. The gate resistor 20 connects between terminal AC2 of the full wave rectifier 19 and the gate of the TRIAC 21. The TRIAC slave circuit 180 comprises a gate resistor 22 and a TRIAC 23. The gate resistor 22 connects between terminal MT₁ of the TRIAC 21 and the gate of TRIAC 23.

A snobber circuit 220 formed by the series connection of a snobber circuit capacitor 24 to a snobber circuit resistor 25 is connected at one end to the output terminal 3 and at the other end to the output terminal 4.

The SCR driver circuit 190 comprises a gate resistor 29, an SCR 28, and diodes 26 and diode 27 connected at their N-junctions and to the anode of the SCR 28. The gate resistor 29 is connected between the gate of the SCR 28 and the cathode of the same SCR 28.

The SCR slave circuit 200 is comprised of diodes 30 and 33 and SCRs 31 and 32. The gates of the SCRs 31 and 32 are interconnected and further connected to the cathode of the SCR 28 contained in the SCR driver circuit 190. Specifically, the SCR 31 is connected in series with the diode 30 between the output terminal 3 and 4. The SCR 32, on the other hand, is connected in series with the diode 33 between the output terminals 3 and 4.

In operation, the output terminal 3 is connected to one terminal of an AC power supply and the output terminal 4 is connected to a first terminal of the load 34. The second terminal of the load 34 is then connected to the other terminal of the AC power supply. The load 34 is in series between the AC power supply and the second output terminal 4 as is illustrated in FIG. 2. An alternative embodiment can be achieved by placing the load in series between the output terminal 3 and the AC power supply, and a still further embodiment can be constructed wherein a load exists in series between the AC power supply and the output terminal 4 and another load exists between the AC power supply and the output terminal 3. In each of these cases, the relay performs the desired ON or OFF function by simply breaking open the current loop that links the AC power supply to the load.

When it is desired to not supply the load with AC power, no input signals are supplied to the input terminals 1 and 2. Thus, no voltage appears across the LED 8A contained in the optical coupler 110. The collector of the transistor 13 contained in the switch circuit 130 will receive a voltage from the two terminals of the zener diode 10 located in the reference voltage circuit 120. Because the optical coupler 110 assumes or remains in an open circuit condition, a zero potential will appear across the two terminals of the resistor 12 located at the base of the transistor 13. The result is an open circuit condition at the SCR saturation circuit 140.

Under this condition, if the SPDT switch 18 is in position A, the AC2 terminal of the full wave bridge rectifier 19 will produce a zero voltage which, in turn, creates a zero potential difference across the gate resistor 20 located at the gate to the TRIAC 21. This causes the MT2 and MT1 terminals of the TRIAC 21 to remain in or assume the OFF state and drive the gate resistor 22 into a zero potential condition. That is, the TRIAC 21 does not conduct and, therefore, causes a zero voltage to appear across the gate resistor 22 located at the gate of the TRIAC 23. The zero voltage across the gate resistor 22 then forces the TRIAC 23 to remain in or assume the OFF state. The end result is an open circuit condition across the two output terminals of the relay thus preventing the supply of AC power to the load 34.

Alternatively, when the SPDT switch 18 is in position B and an open circuit condition exists at the SCR saturation circuit 140, a zero voltage will appear across the terminals of the third gate resister 29. This zero voltage prevents the SCR 28 from conducting through the diode 26 during a positive half cycle and through the diode 27 during the other half cycle of the AC signal. The result is an absence of the signal needed for driving the SCRs 31 and 32 into their ON state. Since the SCRs 31 and 32 remain in or assume their OFF state, an open circuit condition exists across the two output terminals of the relay thus preventing the supply of AC power to the load 34.

The two above-described scenarios describe how a preferred embodiment of the instant invention prevents the delivery of AC power to a load 34. Either scenario can be achieved by simply selecting the appropriate SPDT switch 18 position (A or B) and maintaining the absence of input signals at the input terminals of the relay.

Conversely, when it is desired to provide AC power to the load 34, an input signal is introduced at the input terminals of the relay. The input signal may comprise AC voltages, DC voltages or voltage pulses depending on the needs of the user.

As AC input signals enter the input circuit, they are rectified for compatibility with the LED 8A contained in the optical coupler 110. The AC input signals pass through the diode 5 and the diode 35 only during the half cycle which produces a positive voltage at the first input terminal 1. During this half cycle a current determined by the resistance of the current limiting resistor 7 and the capacitance of the filtering capacitor 6 begins to flow through the LED 8A contained in the optical coupler 110. This current flow establishes a voltage across the LED 8A and current limiting resistor 7. It is to this voltage that the filtering capacitor 6 begins to be charged. Similarly, as the AC input signal enters its other half cycle, the diode 5 and the diode 35 cease to conduct, thereby allowing the filtering capacitor 6 to discharge through the current limiting 7 and the LED 8A of the optical coupler 110. In this manner, an AC input signal can provide a steady ON state for the relay circuit of the present invention.

A DC voltage can be employed in a similar manner as an input signal by connecting a DC voltage source such that the first input terminal 1 is referenced to the positive voltage terminal of the source.

Regardless of the input signal used, the application of such a signal creates a conductive state at the output of the optical coupler 110. This conductive state permits current to flow through the base resistor 12 so that a positive voltage appears at the base of the transistor 13. This base voltage activates the transistor 13 and allows a positive voltage to appear at the gate of the first SCR 15. The SCR is thus rendered conductive and allows current to flow from its anode to its cathode.

In the case when the SPDT switch 18 is in position A, the AC2 terminal of the full wave bridge rectifier 19 provides an AC voltage to the gate of the TRIAC 21 thereby driving the MT1 and MT2 terminals of the first TRIAC 21 into the ON state. Once the TRIAC 21 begins to conduct, it provides AC power from the output terminal 3 to the gate of the TRIAC 23. The resulting AC signal at the gate of the TRIAC 23 drives the second TRIAC into the ON state and provides a conductive path through which AC power can be delivered to the load 34.

If the SPDT switch 18 is in position B while the first SCR 15 is in its conductive (ON) state, then a positive voltage will appear across the gate resistor 29. This positive voltage renders the SCR 28 conductive, allowing current to flow through the diode 26 and the diode 27, through the SCR 28, and to the gates of the SCR 32 and the SCR 31. At this point, current is also able to flow from the output terminal 3, through the SCR 32 and the diode 33, to the output terminal 4 during one half cycle and from the output terminal 4, through the SCR 31 and diode 30, to the first output terminal 3 during the other half cycle. In this manner, AC power is applied to the load 34 according to an input signal received at the input terminals of the relay.

The circuitry of the instant invention can be modified to compensate for significant loading conditions. That is, a method is provided for adapting the inventive circuitry to allow the switching of very high currents and very high voltages. With 15 regard to the TRIAC portion of the circuit, an additional TRIAC can be added such that the additional TRIAC is driven by the TRIAC 23. The number of TRIACs that can be added in this manner is limitless and depends solely upon the magnitude of the load 34.

Likewise, to compensate for significant loading in the SCR portion of the circuit, an SCR can be added between the gates of the SCR 28, the SCR 31, and the SCR 32. Specifically, the cathode of the SCR 28 is connected to the gate of the added SCR; the anode of the added SCR is connected to the anode of the SCR 28; and the cathode of the added SCR is connected to the gates of the SCR 31 and the SCR 32. The number of SCRs added is limitless and depends upon the magnitude of the load 34 as well as the trigger current required by the SCR 31 and the SCR 32.

Although the invention has been described with reference to a particular embodiment, it will be understood that this embodiment is merely illustrative of the application of the principles of this invention. It will be further understood that numerous modifications of the inventive embodiment may be made and other arrangements may be devised without departing from the spirit and scope of this invention. For example, in the preferred embodiment, the transistor 13 is shown to be of the NPN type. It is understood, however, that a PNP transistor can be substituted by exchanging the emitter of a PNP transistor with the collector of the NPN transistor and by exchanging the collector of the PNP transistor with the emitter of the NPN transistor. The base connection can remain unchanged. This modification converts the inventive circuit into a reversed solid state relay and illustrates that the type of transistor used is limitless and depends upon the requirements of each individual application.

Similarly, since the SCR saturation circuit of the present invention is primarily used as a saturation circuit, a variety of electrical components can be utilized in place of the SCR 15 to form a saturation circuit. Bipolar transistors, MOSFETs, and IGBTs are just some examples of such components.

The snobber circuit, which comprises of the snobber circuit capacitor 24 and the snobber circuit resistor 25, can also be modified to conform to an unlimited variety of loading conditions. Specifically, the resistance and capacitance of the circuit can be adjusted to meet the power requirements of the load 34.

Many more modifications and variations of the instant invention are possible--the above listing is anything but exhaustive.

I claim:

1. A dual solid state relay for controlling the supply of power to a load comprising:
   an input circuit for receiving AC, DC or voltage pulse control signals;
   an optical coupler circuit connected to the input circuit for isolating the input circuit from the remainder of the relay and being responsive to an input signal at said input circuit to generate as output a signal representative thereof;
   an amplifying circuit connected to the optical coupler circuit for increasing the level of the output signal of the optical coupler circuit;
   a reference voltage circuit connected to the optical coupler and to the amplifying circuit for controlling a gain of the amplifying circuit;
   an SCR saturation circuit connected to the amplifying circuit for generating a driver control signal;
   a single pole double throw switch connected to the SCR saturation circuit and having a switch member movable between first and second switch contacts;
   a full-wave rectifier circuit connected to the first switch contact for rectifying the driver control signal of the SCR saturation circuit to generate a rectified driver control signal when the switch member of the single pull double throw switch is in said first switch contacts;
   a TRIAC driver circuit connected to the full-wave rectifier circuit and responsive to the rectified driver control signal to generate a TRIAC drive signal;
   a TRIAC slave circuit connected to the TRIAC driver circuit and responsive to the TRIAC drive signal to assume one of an ON or OFF state;
   an SCR driver circuit connected to the second switch contact and responsive to the driver control signal to generate a SCR drive signal;

a SCR slave circuit connected to the SCR driver circuit and responsive to the SCR drive signal to assume one of an ON or OFF state; and an output port connected to the SCR slave circuit, to the TRIAC slave circuit, and to the load so that the power is supplied to the load when either the SCR slave circuit or the TRIAC slave circuit is in the ON state and power is not supplied to the load when both the SCR slave circuit and the TRIAC slave circuit are in the OFF state.

2. The dual solid state relay of claim 1, wherein the input circuit comprises first and second input terminals, a first diode connected to the first input terminal and a second diode connected to the second input terminal, a capacitor connected between the first and second diodes and a limiting resistor connected at one terminal to the junction of the first diode and the capacitor.

3. The dual solid state relay of claim 2, wherein said first and second input terminals are connected to an AC input signal so that said first and second diodes are biased during a positive cycle of the AC input signal for charging the capacitor and so that the capacitor discharges through said limiting resistor during the negative cycle of the AC input signal.

4. The dual solid state relay of claim 2, wherein said first input terminal is connected to a DC power supply.

5. The dual solid state relay of claim 2, wherein said optical coupler comprises:

an LED connected in series between said limiting resistor and said second diode of said input circuit; and a bipolar junction transistor optically having a base optical coupler to said LED.

6. The dual solid state relay of claim 1, wherein said output port comprises first and second output terminals, each of said TRIAC slave circuits and said SCR slave circuits being connected to said first and second output terminals and to a first terminal of a power source, the load being connected to said second output terminal and a second terminal of the power source, whereby a closed current path is provided for current to flow from said power source through said load when either of said SCR slave circuit or said TRIAC slave circuit is in the ON state.

7. The dual solid state relay of claim 1, wherein said TRIAC driver circuit comprises a driver TRIAC and a driver gate resistor, the driver gate resistor being connected to an output terminal of the full-wave rectifier circuit and to a gate of the driver TRIAC, and wherein said TRIAC slave circuit comprises a slave TRIAC and a slave gate resistor, the slave gate resistor being connected to an output terminal of the driver TRIAC and to the gate of the slave TRIAC.

8. The dual solid state relay of claim 1, wherein said SCR driver circuit comprises a driver SCR, a driver gate resistor and first and second driver diodes, the gate of the driver SCR being connected to the second switch contact of the single pole double throw switch, the driver gate resistor being connected between the gate of the driver SCR and the anode of the driver SCR, the first and second driver diodes being connected to the cathode of the driver SCR, and wherein the SCR slave circuit comprises a first and second slave SCR's and first and second slave diodes, the gates of the first and second slave SCR's being connected to each other and to the anode of the driver SCR of the SCR driver circuit, the anode of the first slave diode being connected to the cathode of the first slave SCR and the cathode of the first slave diode being connected to the anode of the second slave SCR, the anode of the second slave diode being connected to the cathode of the second slave SCR and the cathode of the second slave diode being connected to the anode of the first slave SCR.

9. The dual solid state relay of claim 1, wherein said TRIAC slave circuit comprises a plurality of TRIAC circuits and said SCR slave circuit comprises a plurality of SCR circuits according to desired load conditions.

* * * * *